United States Patent
Yang et al.

(10) Patent No.: US 11,809,706 B2
(45) Date of Patent: Nov. 7, 2023

(54) MEMORY MANAGEMENT METHOD, MEMORY STORAGE DEVICE, AND MEMORY CONTROL CIRCUIT UNIT

(71) Applicant: PHISON ELECTRONICS CORP., Miaoli (TW)

(72) Inventors: Yu-Siang Yang, New Taipei (TW); Yu-Cheng Hsu, Yilan County (TW); Tsai-Hao Kuo, Tainan (TW); Wei Lin, Taipei (TW); An-Cheng Liu, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 71 days.

(21) Appl. No.: 17/349,918

(22) Filed: Jun. 17, 2021

(65) Prior Publication Data
US 2022/0342547 A1 Oct. 27, 2022

(30) Foreign Application Priority Data
Apr. 26, 2021 (TW) .................................. 110114836

(51) Int. Cl.
*G06F 3/06* (2006.01)
(52) U.S. Cl.
CPC .......... *G06F 3/0604* (2013.01); *G06F 3/0619* (2013.01); *G06F 3/0655* (2013.01); *G06F 3/0679* (2013.01)
(58) Field of Classification Search
CPC .... G06F 3/0604; G06F 3/0619; G06F 3/0655; G06F 3/0679
See application file for complete search history.

(56) References Cited

U.S. PATENT DOCUMENTS

| | | | |
|---|---|---|---|
| 10,176,041 B2* | 1/2019 | Wu | G06F 11/1068 |
| 2014/0146605 A1* | 5/2014 | Yang | G11C 11/5642 |
| | | | 365/185.03 |
| 2017/0091039 A1* | 3/2017 | Hong | G11C 29/021 |
| 2017/0125111 A1* | 5/2017 | Sankaranarayanan | ......... |
| | | | G06F 11/0793 |
| 2017/0242748 A1* | 8/2017 | Lin | H03M 13/3707 |
| 2018/0046527 A1 | 2/2018 | Reusswig et al. | |

(Continued)

FOREIGN PATENT DOCUMENTS

| CN | 107092536 | 8/2017 |
|---|---|---|
| TW | 202042242 | 11/2020 |

OTHER PUBLICATIONS

"Office Action of Taiwan Counterpart Application", dated Jan. 17, 2022, p. 1-p. 6.

(Continued)

*Primary Examiner* — Ryan Bertram
(74) *Attorney, Agent, or Firm* — JCIPRNET

(57) ABSTRACT

A memory management method, a memory storage device, and a memory control circuit unit are provided. The method includes: reading first data from a first physical unit by using a first read voltage level according to first management information among multiple candidate management information; decoding the first data and recording first error bit information of the first data; and adjusting sorting information related to the candidate management information according to the first error bit information. The sorting information reflects a usage order of the candidate management information in a decoding operation.

18 Claims, 9 Drawing Sheets

(56) References Cited

U.S. PATENT DOCUMENTS

2018/0246782 A1* 8/2018 Zeng .................. G11C 11/5642
2019/0108091 A1* 4/2019 Chen .................. G06F 11/1068
2020/0133767 A1* 4/2020 Yang ................. H03M 13/1111
2022/0148671 A1* 5/2022 Ren ........................ G11C 29/52

OTHER PUBLICATIONS

"Office Action of China Counterpart Application", dated May 7, 2023, p. 1-p. 8.

\* cited by examiner

MEMORY MANAGEMENT METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 110114836, filed on Apr. 26, 2021. The entirety of the above-mentioned patent application is hereby incorporated by reference herein and made a part of this specification.

BACKGROUND

Technical Field

The disclosure relates to a memory management technology, and particularly relates to a memory management method, a memory storage device, and a memory control circuit unit.

Description of Related Art

Portable electronic devices such as mobile phones and notebook computers have grown rapidly in the past few years, which has led to a rapid increase in consumer demand for storage media. Since the rewritable non-volatile memory module (for example, a flash memory) has characteristics such as non-volatile data, power saving, small size, and no mechanical structure, the rewritable non-volatile memory module is very suitable to be built into the various portable multimedia devices exemplified above.

Generally speaking, before storing data into the rewritable non-volatile memory module, the data is encoded first. When the data is to be read, the read data may be decoded to try to correct errors therein. In addition, the setting of the read voltage level for reading the data also has a great influence on the correctness of the read data. Generally speaking, multiple management forms may be stored in the rewritable non-volatile memory module. When the data is to be read, the management forms may be queried according to a preset order, so as to determine the read voltage level used for the current reading according to information in the management form sorted first among the management forms. If the data read using the read voltage level cannot be correctly decoded, information in the next management form sorted after the management form may be queried to determine the read voltage level used for the next reading. However, sequentially querying the management forms according to the preset order may result in a decrease in data decoding efficiency due to changes in the threshold voltage distribution of memory cells in the rewritable non-volatile memory module.

SUMMARY

The disclosure provides a memory management method, a memory storage device, and a memory control circuit unit, which can improve data decoding efficiency.

An exemplary embodiment of the disclosure provides a memory management method, which is used in a memory storage device. The memory storage device comprises a rewritable non-volatile memory module. The rewritable non-volatile memory module comprises multiple physical units. The memory management method comprises the following steps. First data is read from a first physical unit among the physical units by using a first read voltage level according to first management information among multiple candidate management information. The first data is decoded and first error bit information of the first data is recorded. Sorting information related to the candidate management information is adjusted according to the first error bit information. The sorting information reflects a usage order of the candidate management information in a decoding operation.

An exemplary embodiment of the disclosure further provides a memory storage device, which comprises a connection interface unit, a rewritable non-volatile memory module, and a memory control circuit unit. The connection interface unit is configured to couple to a host system. The rewritable non-volatile memory module comprises multiple physical units. The memory control circuit unit is coupled to the connection interface unit and the rewritable non-volatile memory module. The memory control circuit unit is configured to send a first read command sequence according to first management information among multiple candidate management information, which instructs to read first data from a first physical unit among the physical units by using a first read voltage level. The memory control circuit unit is further configured to decode the first data and record first error bit information of the first data. The memory control circuit unit is further configured to adjust sorting information related to the candidate management information according to the first error bit information. The sorting information reflects a usage order of the candidate management information in a decoding operation.

An exemplary embodiment of the disclosure further provides a memory control circuit unit, which is configured to control a rewritable non-volatile memory module. The rewritable non-volatile memory module comprises multiple physical units. The memory control circuit unit comprises a host interface, a memory interface, an error detecting and correcting circuit, and a memory management circuit. The host interface is configured to couple to a host system. The memory interface is configured to couple to the rewritable non-volatile memory module. The memory management circuit is coupled to the host interface, the memory interface, and the error detecting and correcting circuit. The memory management circuit is configured to send a first read command sequence according to first management information among multiple candidate management information, which instructs to read first data from a first physical unit among the physical units by using a first read voltage level. The error detecting and correcting circuit is configured to decode the first data and record first error bit information of the first data. The memory management circuit is further configured to adjust sorting information related to the candidate management information according to the first error bit information. The sorting information reflects a usage order of the candidate management information in a decoding operation.

Based on the above, after reading the first data from the first physical unit by using the first read voltage level according to the first management information among the candidate management information, the first data may be decoded and the first error bit information of the first data may be recorded. Thereafter, the sorting information related to the candidate management information may be adjusted according to the first error bit information. In this way, the correctness of data when subsequently executing data reading according to the sorting information can be effectively improved, thereby improving data decoding efficiency.

DETAILED DESCRIPTION OF DISCLOSED EMBODIMENTS

Generally speaking, a memory storage device (also referred to as a memory storage system) comprises a rewritable non-volatile memory module and a controller (also referred to as a control circuit). Usually, the memory storage device may be used together with a host system, so that the host system may write data into the memory storage device or read data from the memory storage device.

Figure 1:
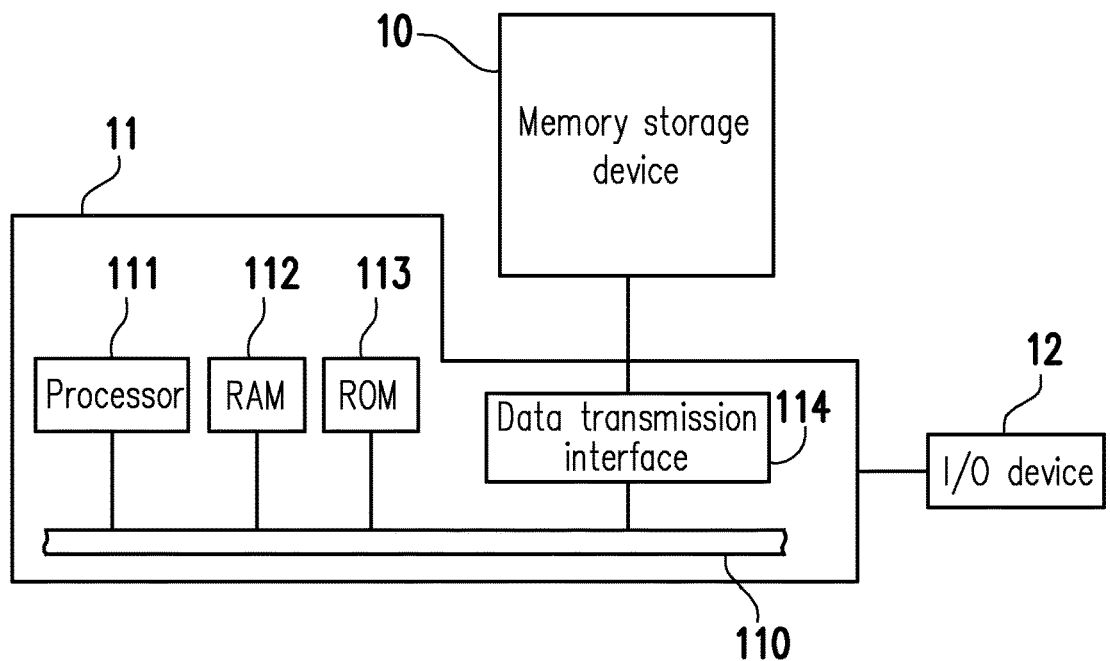
FIG. 1 is a schematic diagram of a host system, a memory storage device, and an input/output (I/O) device according to an exemplary embodiment of the disclosure.
Figure 2:
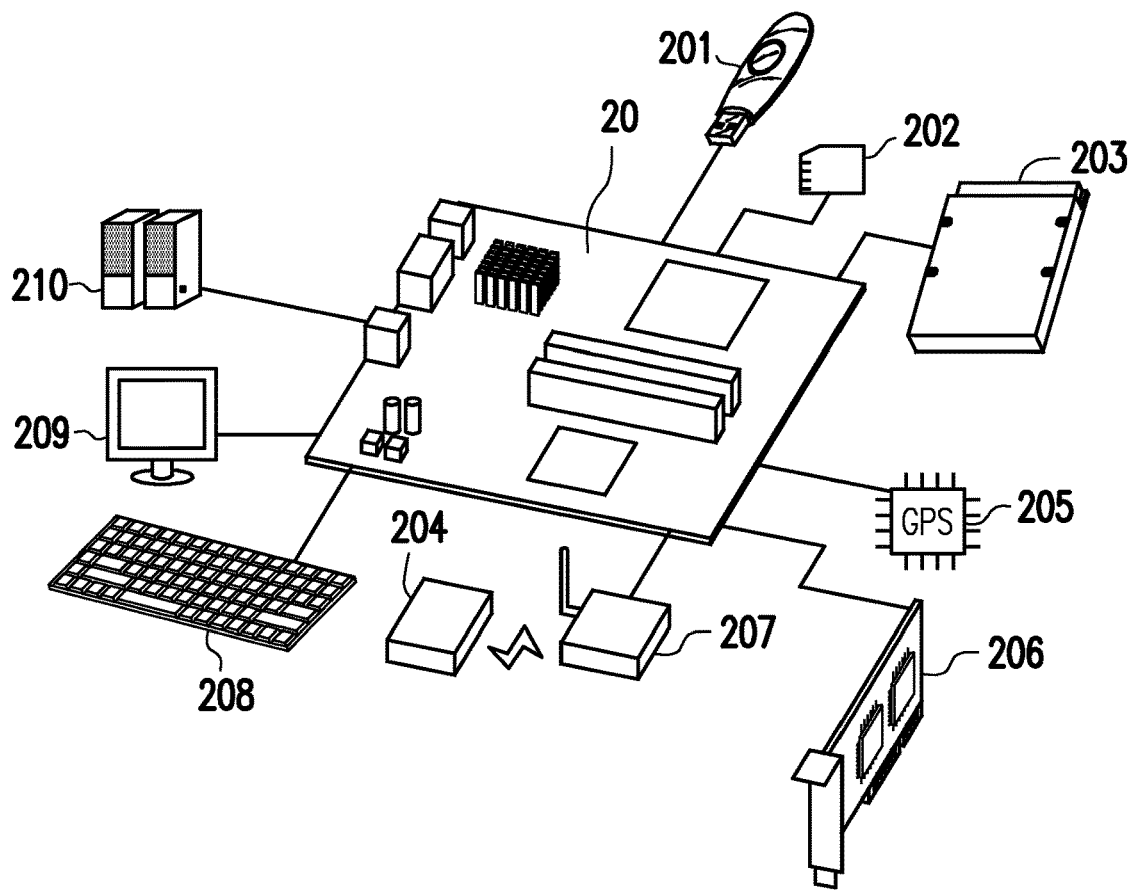
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Please refer to FIG. 1 and FIG. 2. A host system 11 may include a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In an exemplary embodiment, the host system 11 may be coupled to the memory storage device 10 through the data transmission interface 114. For example, the host system 11 may store data into the memory storage device 10 or read data from the memory storage device 10 via the data transmission interface 114. In addition, the host system 11 may be coupled to the I/O device 12 through the system bus 110. For example, the host system 11 may send an output signal to the I/O device 12 or receive an input signal from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. Through the data transmission interface 114, the motherboard 20 may be coupled to the memory storage device 10 via a wired or wireless manner.

In an exemplary embodiment, the memory storage device 10 may be, for example, a flash drive 201, a memory card 202, a solid state drive (SSD) 203, or a wireless memory storage device 204. The wireless memory storage device 204 may be, for example, a near field communication (NFC) memory storage device, a wireless fax (WiFi) memory storage device, a Bluetooth memory storage device, a low-power Bluetooth memory storage device (for example, iBeacon), or other memory storage devices based on various wireless communication technologies. In addition, the motherboard 20 may also be coupled to a global positioning system (GPS) module 205, a network interface card 206, a wireless transmission device 207, a keyboard 208, a screen 209, a speaker 210, or various other I/O devices through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data.

Figure 3:
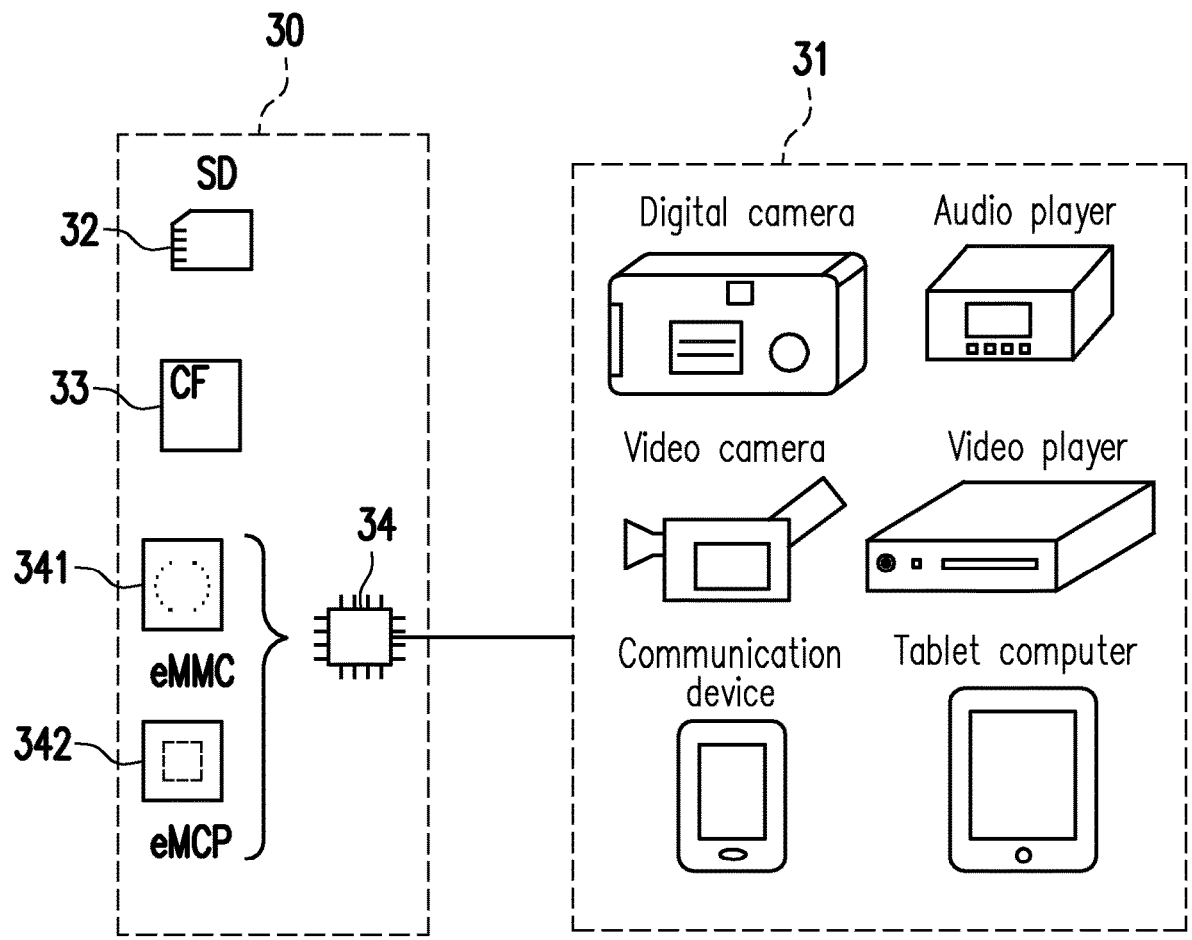
FIG. 3 is a schematic diagram of a host system and a memory storage device according to an exemplary embodiment of the disclosure.

FIG. 3 is a schematic diagram of a host system and a memory storage device according to an exemplary embodiment of the disclosure. Please refer to FIG. 3. In an exemplary embodiment, a host system 31 may be a digital camera, a video camera, a communication device, an audio player, a video player, a tablet computer, or other systems. A memory storage device 30 may be a secure digital (SD) card 32, a compact flash (CF) card 33, an embedded storage device 34, or various other non-volatile memory storage devices used by the host system 31. The embedded storage device 34 comprises an embedded multi media card (eMMC) 341, an embedded multi chip package (eMCP) storage device 342, and/or various other embedded storage devices in which a memory module is directly coupled onto a substrate of a host system.

Figure 4:
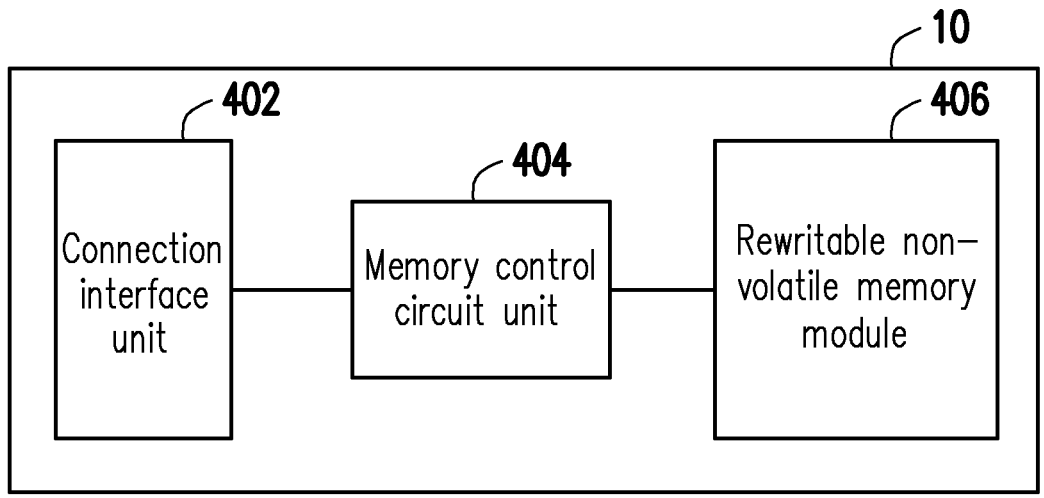
FIG. 4 is a schematic block diagram of a memory storage device according to an exemplary embodiment of the disclosure.

FIG. 4 is a schematic block diagram of a memory storage device according to an exemplary embodiment of the disclosure. Please refer to FIG. 4. The memory storage device 10 comprises a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 via the connection interface unit 402. In an exemplary embodiment, the connection interface unit 402 is compatible with the serial advanced technology attachment (SATA) standard. In an exemplary embodiment, the connection interface unit 402 may also conform to the parallel advanced technology attachment (PATA) standard, the Institute of Electrical and Electronic Engineers (IEEE) 1394 standard, the high-speed peripheral component interconnect express (PCI express) standard, the universal serial bus (USB) standard, the SD interface standard, the ultra high speed-I (UHS-I) interface standard, the ultra high speed-II (UHS-II) interface standard, the memory stick (MS) interface standard, the multi chip package (MCP) interface standard, the multi media card (MMC) interface standard, the eMMC interface standard, the universal flash storage (UFS) interface standard, the eMCP interface standard, the CF interface standard, the integrated device electronics (IDE) standard, or other suitable standards. The connection interface unit 402 and the memory control circuit unit 404 may be packaged in a chip, or the connection interface unit 402 may be arranged outside a chip including the memory control circuit unit 404.

The memory control circuit unit 404 is coupled to the connection interface unit 402 and the rewritable non-volatile memory module 406. The memory control circuit unit 404 is configured to execute multiple logic gates or control commands implemented in the form of hardware or the form of firmware and perform operations such as data writing, reading, and erasing in the rewritable non-volatile memory module 406 according to a command of the host system 11.

The rewritable non-volatile memory module 406 is configured to store data written by the host system 11. The rewritable non-volatile memory module 406 may include a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristics.

Each memory cell in the rewritable non-volatile memory module 406 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data to the memory cell" or "programming the memory cell". As the threshold voltage changes, each memory cell in the rewritable non-volatile memory module 406 has multiple storage states. Through applying a read voltage, it is possible to judge which storage state a memory cell belongs to, thereby obtaining one or more bits stored in the memory cell.

In an exemplary embodiment, the memory cells of the rewritable non-volatile memory module 406 may constitute multiple physical programming units, and the physical programming units may constitute multiple physical erasing units. Specifically, the memory cells on the same word line may form one or more physical programming units. If each memory cell may store more than 2 bits, the physical programming units on the same word line may be classified into at least a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in the MLC NAND flash memory, the write speed of the lower physical programming unit is greater than the write speed of the upper physical programming unit, and/or the reliability of the lower physical programming unit is higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area contains multiple physical sectors for storing user data, and the redundancy bit area is configured to store system data (for example, management data such as an error correcting code). In an exemplary embodiment, the data bit area contains 32 physical sectors, and the size of one physical sector is 512 bytes (B). However, in other exemplary embodiments, the data bit area may also contain 8, 16, more, or less physical sectors, and the size of each physical sector may also be greater or smaller. On the other hand, the physical erasing unit is the smallest unit of erasure. That is, each physical erasing unit contains the smallest number of memory cells to be erased together. For example, the physical erasing unit is a physical block.

Figure 5:
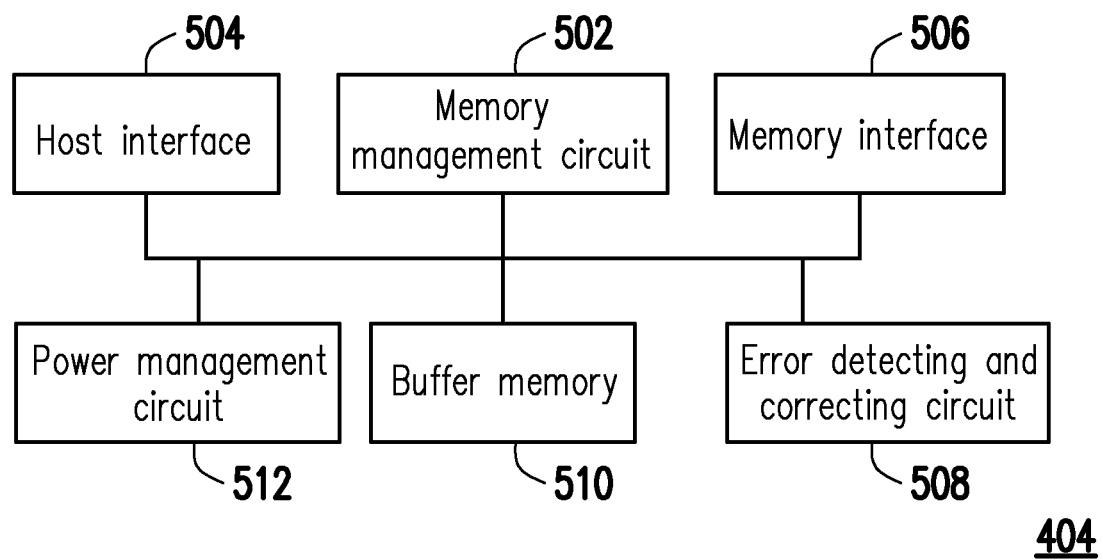
FIG. 5 is a schematic block diagram of a memory control circuit unit according to an exemplary embodiment of the disclosure.

FIG. 5 is a schematic block diagram of a memory control circuit unit according to an exemplary embodiment of the disclosure. Please refer to FIG. 5. The memory control circuit unit 404 comprises a memory management circuit 502, a host interface 504, a memory interface 506, and an error detecting and correcting circuit 508.

The memory management circuit 502 is configured to control the overall operation of the memory control circuit unit 404. Specifically, the memory management circuit 502 has multiple control commands, and the control commands are executed to perform operations such as data writing, reading, and erasing when the memory storage device 10 is operating. The following description of the operation of the memory management circuit 502 is equivalent to the description of the operation of the memory control circuit unit 404.

In an exemplary embodiment, the control commands of the memory management circuit 502 are implemented in the form of firmware. For example, the memory management circuit 502 has a microprocessor unit (not shown) and a read only memory (not shown), and the control commands are burnt into the read only memory. When the memory storage device 10 is operating, the control commands are executed by the microprocessor unit to perform operations such as data writing, reading, and erasing.

In an exemplary embodiment, the control commands of the memory management circuit 502 may also be stored into a specific region (for example, a system area dedicated to storing system data in a memory module) of the rewritable non-volatile memory module 406 in the form of program codes. In addition, the memory management circuit 502 has a microprocessor unit (not shown), a read only memory (not shown), and a random access memory (not shown). In particular, the read only memory has a boot code, and the microprocessor unit first executes the boot code to load the control commands stored in the rewritable non-volatile memory module 406 into the random access memory of the memory management circuit 502 when the memory control circuit unit 404 is enabled. After that, the microprocessor unit runs the control commands to perform operations such as data writing, reading, and erasing.

In an exemplary embodiment, the control commands of the memory management circuit 502 may also be implemented in the form of hardware. For example, the memory management circuit 502 comprises a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage a memory cell or a memory cell group of the rewritable non-volatile memory module 406. The memory write circuit is configured to issue a write command sequence to the rewritable non-volatile memory module 406 to write data into the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. The write command sequence, the read command sequence, and the erase command sequence may each include one or more program codes or command codes and are configured to instruct the rewritable non-volatile memory module 406 to execute corresponding operations such as writing, reading, and erasing. In an exemplary embodiment, the memory management circuit 502 may also issue other types of command sequences to the rewritable non-volatile memory module 406 to instruct to execute corresponding operations.

The host interface 504 is coupled to the memory management circuit 502. The memory management circuit 502 may communicate with the host system 11 through the host interface 504. The host interface 504 may be configured to receive and identify commands and data sent by the host system 11. For example, the commands and the data sent by the host system 11 may be sent to the memory management circuit 502 through the host interface 504. In addition, the memory management circuit 502 may send the data to the host system 11 through the host interface 504. In this exemplary embodiment, the host interface 504 is compatible with the SATA standard. However, it must be understood that the disclosure is not limited thereto. The host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and is configured to access the rewritable non-volatile memory module 406. That is to say, the data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 will send the corresponding command sequence. For example, the command sequences may include the write command sequence instructing to write data, the read command sequence instructing to read data, the erase command sequence instructing to erase data, and corresponding command sequences instructing various memory operations (for example, changing a read voltage level, executing a garbage collection operation, etc.). The command sequences are, for example, generated by the memory management circuit 502 and sent to the rewritable non-volatile memory module 406 through the memory interface 506. The command sequences may include one or more signals, or data on a bus. The signals or the data may include command codes or program codes. For example, the read command sequence comprises information such as a read recognition code and a memory address.

The error detecting and correcting circuit 508 is coupled to the memory management circuit 502 and is configured to execute error detecting and correcting operations to ensure the correctness of data. Specifically, when the memory management circuit 502 receives the write command from the host system 11, the error detecting and correcting circuit 508 generates a corresponding error correcting code (ECC) and/or error detecting code (EDC) for the data corresponding to the write command, and the memory management circuit 502 writes the data corresponding to the write command and the corresponding ECC and/or EDC into the rewritable non-volatile memory module 406. Later, when the memory management circuit 502 reads the data from the rewritable non-volatile memory module 406, the ECC and/or the EDC corresponding to the data will also be simultaneously read, and the error detecting and correcting circuit 508 will execute the error detecting and correcting operations on the read data according to the ECC and/or the EDC.

In an exemplary embodiment, the memory control circuit unit 404 further comprises a buffer memory 510 and a power management circuit 512. The buffer memory 510 is coupled to the memory management circuit 502 and is configured to temporarily store data and commands from the host system 11 or data from the rewritable non-volatile memory module 406. The power management circuit 512 is coupled to the memory management circuit 502 and is configured to control the power of the memory storage device 10.

In an exemplary embodiment, the rewritable non-volatile memory module 406 of FIG. 4 is also referred to as a flash memory module, and the memory control circuit unit 404 is also referred to as a flash memory controller for controlling the flash memory module. In an exemplary embodiment, the memory management circuit 502 of FIG. 5 is also referred to as a flash memory management circuit.

Figure 6:
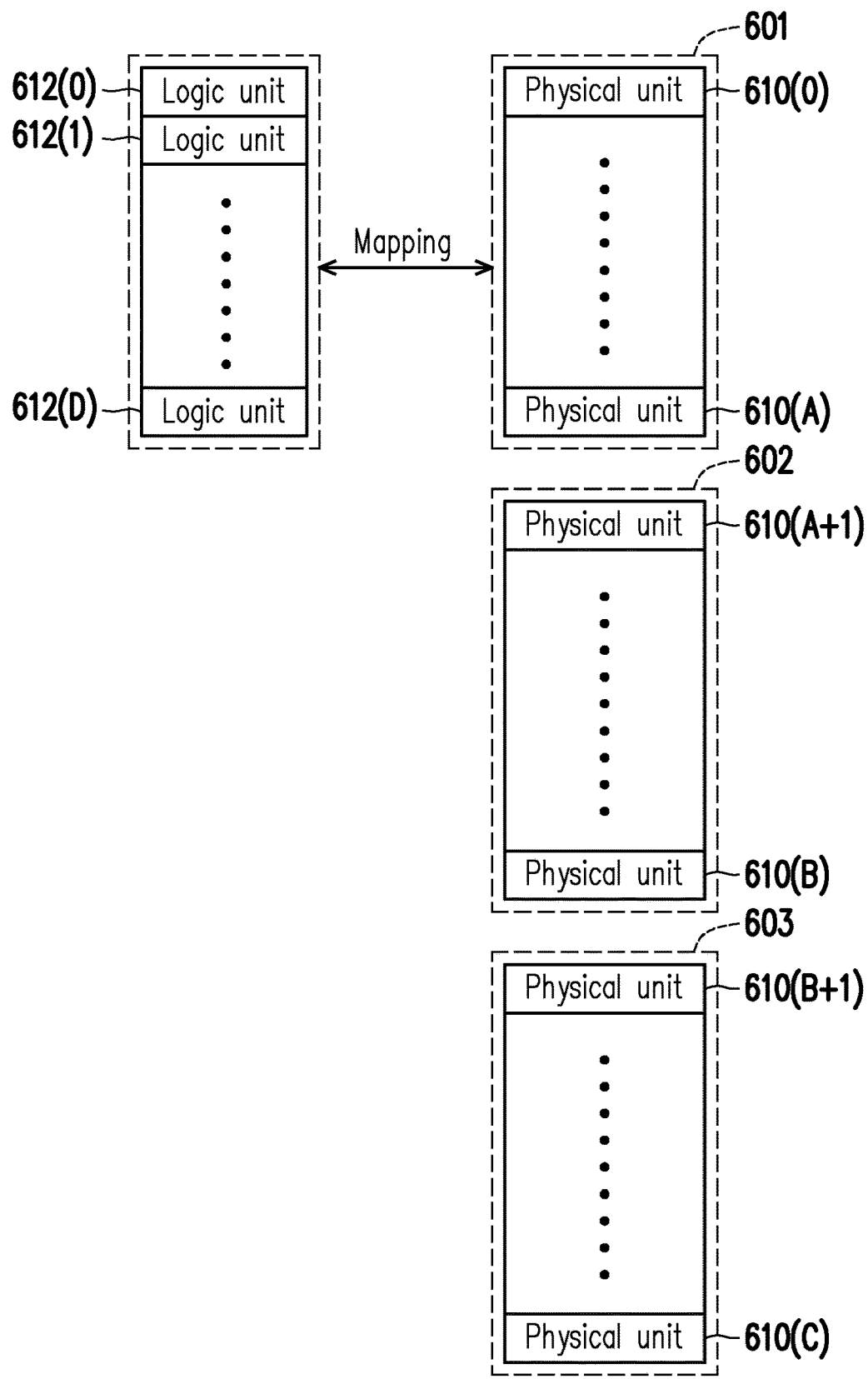
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Please refer to FIG. 6. The memory management circuit 502 may logically group physical units 610(0) to 610(C) in the rewritable non-volatile memory module 406 to a storage area 601, a spare area 602, and a system area 603. The physical units 610(0) to 610(A) in the storage area 601 are stored with data (for example, user data from the host system 11 of FIG. 1). For example, the physical units 610(0) to 610(A) in the storage area 601 may be stored with valid data and invalid data. The physical units 610(A+1) to 610(B) in the spare area 602 are not configured to store data (for example, the valid data). The physical units 610(B+1) to 610(C) in the system area 603 are configured to store management information (also referred to as the system data), such as a logical-to-physical mapping table, a bad block management form, a device model, or other types of management information.

When the data is to be stored, the memory management circuit 502 may select at least one physical unit from the physical units 610(A+1) to 610(B) in the spare area 602 and store the data from the host system 11 or from at least one physical unit in the storage area 601 into the selected physical unit. At the same time, the selected physical unit may be associated to the storage area 601. In addition, if some physical units in the storage area 601 are not stored with the valid data (that is, are only stored with the invalid data), the physical units may be re-associated to the spare area 602.

The memory management circuit 502 may be configured with logic units 612(0) to 612(D) to map the physical units 610(0) to 610(A) in the storage area 601. Each of the logic units 612(0) to 612(D) may be mapped to one or more physical units. In an exemplary embodiment, a physical unit may refer to a physical address. In an exemplary embodiment, a physical unit may also refer to a physical programming unit, a physical erasing unit, or may be composed of multiple continuous or discontinuous physical addresses. In an exemplary embodiment, a logic unit refers to a logic address. In an exemplary embodiment, a logic unit may also refer to a logic programming unit, a logic erasing unit, or may be composed of multiple continuous or discontinuous logic addresses. In addition, it should be noted that in an exemplary embodiment, the memory management circuit 502 may not be configured with logic units mapped to the system area 603 to prevent the management information stored in the system area 603 from being modified by the user.

The memory management circuit 502 may record a mapping relationship (also referred to as logical-to-physical mapping information) between the logic units and the physical units in at least one logical-to-physical mapping table. The logical-to-physical mapping table is stored in the physical units of the system area 603. When the host system 11 intends to read data from the memory storage device 10 or write data into the memory storage device 10, the memory management circuit 502 may execute a data access operation on the memory storage device 10 according to the logical-to-physical mapping table.

In an exemplary embodiment, the memory management circuit 502 may store multiple management forms into the system area 603. Information in each management form is also referred to as candidate management information and may be configured to determine a read voltage level. For example, the candidate management information may include a voltage offset value. The voltage offset value may be configured to adjust a reference voltage level to obtain a read voltage level. The determined read voltage level may be configured to read a physical unit in the storage area 601 to obtain data stored in the physical unit.

In an exemplary embodiment, the error detecting and correcting circuit 508 may execute a decoding operation on the data read from the physical unit to try to correct error bits in the data. For example, the error detecting and correcting circuit 508 may support various encoding/decoding algorithms such as low density parity check (LDPC) code or Bose-Chaudhuri-Hocquenghem (BCH) code. If a certain decoding operation may successfully decode a certain data, the successfully decoded data may be output, for example, sent to the host system 10 to respond to a read request of the host system 10. However, if a certain decoding operation fails to successfully decode a certain data, the memory management circuit 502 may use a different read voltage level to read a first physical unit again to try to reduce the number of error bits in the read data and/or increase the success rate of decoding the read data. Thereafter, the error detecting and correcting circuit 508 may decode the read data again.

Figure 7:
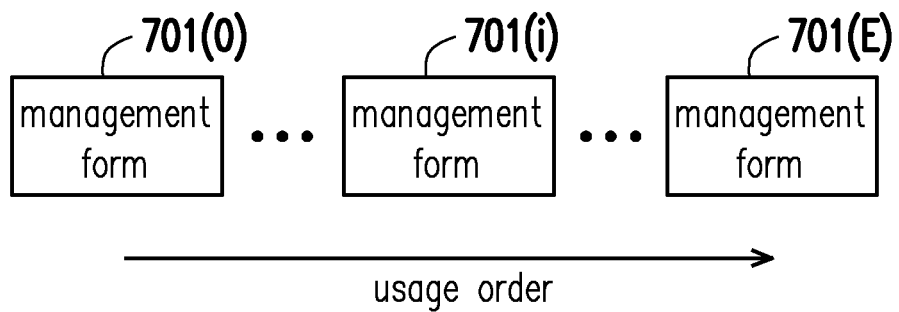
FIG. 7 is a schematic diagram of a management form and a usage order thereof according to an exemplary embodiment of the disclosure.
Figure 8:
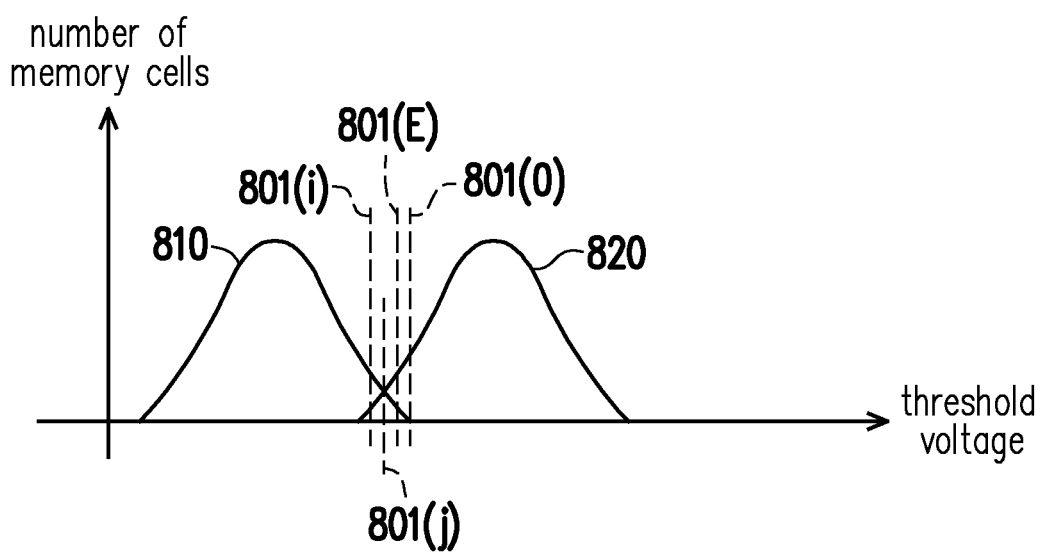
FIG. 8 is a schematic diagram of sequentially using different read voltage levels to read data in a decoding operation according to an exemplary embodiment of the disclosure.

FIG. 7 is a schematic diagram of a management form and a usage order thereof according to an exemplary embodiment of the disclosure. FIG. 8 is a schematic diagram of sequentially using different read voltage levels to read data in a decoding operation according to an exemplary embodiment of the disclosure.

Please refer to FIG. 7. It is assumed that management forms 701(0) to 701(E) are stored in the system area 603 of FIG. 6. Information (that is, candidate management information) in the management forms 701(0) to 701(E) may be respectively configured to determine read voltage levels 801(0) to 801(E) in FIG. 8. For example, the information in the management form 701(0) may be configured to determine the read voltage level 801(0), the information in the management form 701(i) may be configured to determine the read voltage level 801(i), and the information in the management form 701(E) may be configured to determine the read voltage level 801(E), where i may be a positive integer greater than 0 and less than E.

It should be noted that in the decoding operation for the data read from the same physical unit, the usage order of the management forms 701(0) to 701(E) is shown in FIG. 7. For example, the usage order may reflect that the usage priority of the management form 701(0) is higher than the usage priority of the management form 701(i), and the usage priority of the management form 701(i) is higher than the usage priority of the management form 701(E). In addition, information of the usage order of the management forms 701(0) to 701(E) may be recorded in sorting information. The sorting information may also be stored in the system area 603 of FIG. 6.

Please refer to FIG. 8. When data is to be read from a certain physical unit (also referred to as the first physical unit), the memory management circuit 502 may query the sorting information to obtain the information of the usage order of the management forms 701(0) to 701(E). In an exemplary embodiment, the sorting information reflects that the usage priority of the management form 701(0) is the highest. Therefore, the memory management circuit 502 may first determine the read voltage level 801(0) according to the information in the management form 701(0). Then, the memory management circuit 502 may send a read command sequence to the rewritable non-volatile memory module 406 according to the read voltage level 801(0). The read command sequence may instruct the rewritable non-volatile memory module 406 to use the read voltage level 801(0) to read data in the first physical unit.

In an exemplary embodiment, it is assumed that a threshold voltage distribution of multiple memory cells in the first physical unit comprises states 810 and 820. The memory cell belonging to the state 810 is configured to store a certain bit (or bit combination). The memory cell belonging to the state 820 is configured to store another bit (or another bit combination). For example, the memory cell belonging to the state 810 may be configured to store bit "1" (or bit combination "111"), and/or the memory cell belonging to the state 820 may be configured to store bit "0" (or bit combination "000"), etc., which is not limited by the disclosure.

According to the received read command sequence, the rewritable non-volatile memory module 406 may apply the read voltage level 801(0) to the memory cells in the first physical unit. If a certain memory cell may be conducted by the read voltage level 801(0) (for example, the threshold voltage of the memory cell is less than the read voltage level

801(0)), the memory management circuit 502 may judge that the memory cell belongs to the state 810. Conversely, if a certain memory cell is not conducted by the read voltage level 801(0) (for example, the threshold voltage of the memory cell is greater than the read voltage level 801(0)), the memory management circuit 502 may judge that the memory cell belongs to the state 820. In this way, the memory management circuit 502 may obtain the data read from the first physical unit using the read voltage level 801(0). For example, the data may reflect the conducting state of the read voltage level 801(0) on the memory cells in the first physical unit. Then, the error detecting and correcting circuit 508 may decode the data. If the data may be successfully decoded, the error detecting and correcting circuit 508 may output the successfully decoded data.

However, if the data read using the read voltage level 801(0) cannot be successfully decoded, the memory management circuit 502 may read the information in the management form 701($i$) according to the sorting information. The memory management circuit 502 may determine the next read voltage level, that is, the read voltage level 801($i$) according to the information in the management form 701($i$). The memory management circuit 502 may send a read command sequence to the rewritable non-volatile memory module 406 according to the read voltage level 801($i$). The read command sequence may instruct the rewritable non-volatile memory module 406 to use the read voltage level 801($i$) to read the data in the first physical unit. According to the read command sequence, the rewritable non-volatile memory module 406 may apply the read voltage level 801($i$) to the memory cells in the first physical unit. In this way, the memory management circuit 502 may obtain the data read from the first physical unit using the read voltage level 801($i$). The data may reflect the conducting state of the read voltage level 801($i$) on the memory cells in the first physical unit. Then, the error detecting and correcting circuit 508 may decode the data. If the data may be successfully decoded, the error detecting and correcting circuit 508 may output the successfully decoded data.

By analogy, if the data read using the read voltage level 801($i$) cannot be successfully decoded, the memory management circuit 502 may read the information in the management form 701(E) according to the sorting information. The memory management circuit 502 may determine the next read voltage level, that is, the read voltage level 801(E) according to the information in the management form 701(E). Then, the memory management circuit 502 may send a read command sequence to the rewritable non-volatile memory module 406 according to the read voltage level 801(E). The read command sequence may instruct the rewritable non-volatile memory module 406 to use the read voltage level 801(E) to read the data in the first physical unit. According to the read command sequence, the rewritable non-volatile memory module 406 may apply the read voltage level 801(E) to the memory cells in the first physical unit. In this way, the memory management circuit 502 may obtain the data read from the first physical unit using the read voltage level 801(E). The data may reflect the conducting state of the read voltage level 801(E) on the memory cells in the first physical unit. Then, the error detecting and correcting circuit 508 may decode the data.

In an exemplary embodiment, the decoding operation that may be repeatedly executed in the exemplary embodiment of FIG. 8 is also referred to as a hard decoding operation. The hard decoding operation may be configured to repeatedly decode the data read from the first physical unit using different read voltage levels until the management forms 701(0) to 701(E) are exhausted or the read data is successfully decoded. It should be noted that the respective voltage positions of the read voltage levels 801(0) to 801(E), the total number of the read voltage levels 801(0) to 801(E), and the types of the states 810 and 820 of FIG. 8 are all examples and are not intended to limit the disclosure.

In an exemplary embodiment, after reading the data (also referred to as first data) from the first physical unit by using a certain read voltage level (also referred to as a first read voltage level) according to certain management information (also referred to as first management information) in the management forms 701(0) to 701(E), the error detecting and correcting circuit 508 may decode the first data and record error bit information (also referred to as first error bit information) of the first data. The first error bit information may reflect the total number of error bits in the first data. For example, the first error bit information may include the bit error rate (BER) of the first data. The memory management circuit 502 may adjust the sorting information related to the management forms 701(0) to 701(E) according to the first error bit information. For example, the sorting information may reflect the usage order of the management forms 701(0) to 701(E) in the decoding operation, as shown in FIG. 7.

Figure 9:
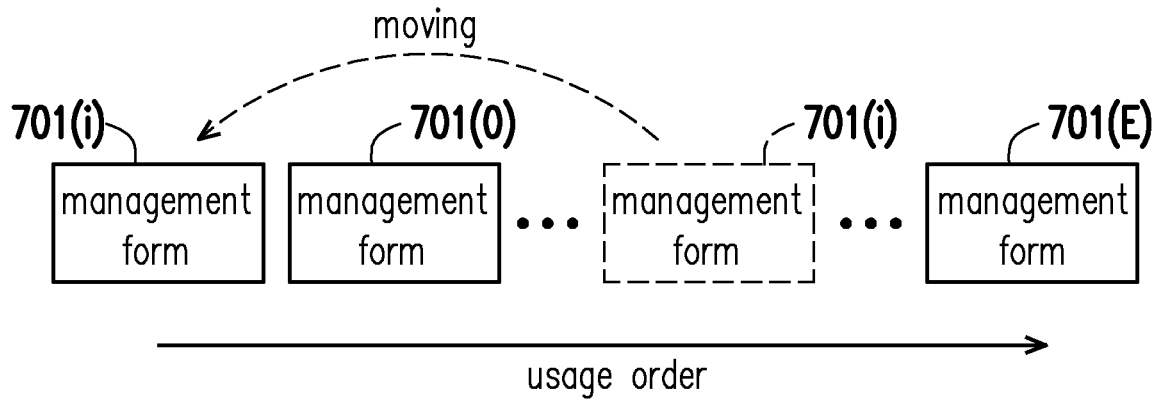
FIG. 9 is a schematic diagram of adjusting sorting information according to an exemplary embodiment of the disclosure.

FIG. 9 is a schematic diagram of adjusting sorting information according to an exemplary embodiment of the disclosure. Please refer to FIG. 9. In an exemplary embodiment, in an operation of adjusting the sorting information related to the management forms 701(0) to 701(E), the usage priority of the management form 701($i$) may be increased to be higher than the usage priority of the management form 701(0). Therefore, the adjusted sorting information may reflect that the usage priority of the management form 701($i$) is higher than the usage priority of the management form 701(0), and the usage priority of the management form 701(0) is higher than the usage priority of the management form 701(E). When using (for example, querying) the management forms 701(0) to 701(E) according to the sorting information next time, the management form 701($i$) may be read before the management form 701(0) to prioritize the determination of the corresponding read voltage level (for example, the read voltage level 801($i$)) according to the information in the management form 701($i$) and the execution of the corresponding data reading and decoding operations. The operation details related to the determination of the read voltage level according to the management forms 701(0) to 701(E) and the execution of the corresponding data reading and decoding operations have been described in detail in the exemplary embodiment of FIG. 8, which will not be repeated here.

In an exemplary embodiment, the total number of error bits in the data read from the first physical unit by using the read voltage level 801($i$) is less than the total number of error bits in the data read from the first physical unit by using the read voltage level 801(0). Therefore, after increasing the usage priority of the management form 701($i$) as shown in FIG. 9, there is a chance to improve decoding efficiency of the next decoding operation executed according to the management forms 701(0) to 701(E).

In an exemplary embodiment, after successfully decoding the first data, the memory management circuit 502 may judge whether the total number of error bits in the first data is greater than a threshold (also referred to as a first threshold) according to the first error bit information. If the total number of error bits in the first data is greater than the first threshold, the memory management circuit 502 may execute the operation of adjusting the sorting information related to the management forms 701(0) to 701(E).

In an exemplary embodiment, it is assumed that the information in the management form 701(0) is the first management information, the read voltage level 801(0) is the first read voltage level, and the data read from the first physical unit by using the read voltage level 801(0) is the first data. After judging that the total number of error bits in the first data is greater than the first threshold, the memory management circuit 502 may adjust the sorting information to increase the usage priority of the management form 701(i) to be higher than the usage priority of the management form 701(0). In this way, there is a chance to improve data decoding efficiency of the subsequent hard decoding operation. In other words, in an exemplary embodiment, the operation of the memory management circuit 502 adjusting the sorting information may be executed in response to the total number of error bits in the first data being greater than the first threshold.

In an exemplary embodiment, in the operation of adjusting the sorting information related to the management forms 701(0) to 701(E), the memory management circuit 502 may read data (also referred to as second data) from the first physical unit by using another read voltage level (also referred to as a second read voltage level) according to another management information (also referred to as second management information) in the management forms 701(0) to 701(E). The second read voltage level is different from the first read voltage level. The error detecting and correcting circuit 508 may decode the second data and record the error bit information (also referred to as second error bit information) of the second data. The second error bit information may reflect the total number of error bits in the second data. The memory management circuit 502 may adjust the sorting information related to the management forms 701(0) to 701(E) according to the second error bit information.

In an exemplary embodiment, it is assumed that the information in the management form 701(i) is the second management information, the read voltage level 801(i) is the second read voltage level, and the data read from the first physical unit by using the read voltage level 801(i) is the second data. In the operation of adjusting the sorting information, the memory management circuit 502 may read the first physical unit by using the read voltage level 801(i) according to the management form 701(i) to obtain the second data, and the error detecting and correcting circuit 508 may decode the second data and record the second error bit information. After successfully decoding the second data, the memory management circuit 502 may judge whether the total number of error bits in the second data is not greater than the first threshold according to the second error bit information. If the total number of error bits in the second data is not greater than the first threshold, the memory management circuit 502 may adjust the sorting information. For example, the memory management circuit 502 may increase the usage priority of the management form 701(i) to be higher than the usage priority of the management form 701(0), as shown in FIG. 9.

In an exemplary embodiment, in the operation of adjusting the sorting information related to the management forms 701(0) to 701(E), if the management forms 701(0) to 701(E) are exhausted, and the data (that is, the second data) whose total number of error bits is not greater than the first threshold is not read, the memory management circuit 502 may execute a search operation to find a read voltage level (also referred to as a third read voltage level). The memory management circuit 502 may adjust the sorting information related to the management forms 701(0) to 701(E) according to an execution result of the search operation.

In an exemplary embodiment, the search operation may be configured to find the read voltage level 801(j) (that is, the third read voltage level) in FIG. 8. Compared to the other read voltage levels in FIG. 8, the data read from the first physical unit by using the read voltage level 801(j) may have fewer or the least error bits. In an exemplary embodiment, the search operation for finding the third read voltage level is also referred to as an optimal read voltage level search operation and/or the third read voltage level is also referred to as an optimal read voltage level.

In an exemplary embodiment, in the operation of adjusting the sorting information related to the management forms 701(0) to 701(E), the memory management circuit 502 may select the management form, such as the management form 701(j), for determining the third read voltage level from the management forms 701(0) to 701(E) according to the third read voltage level. Then, the memory management circuit 502 may increase the usage priority of the management form 701(j) to be higher than the usage priority of the management form 701(0). When using (for example, querying) the management forms 701(0) to 701(E) according to the sorting information next time, the management form 701(j) may be read before the management form 701(0) to prioritize the determination of the corresponding read voltage level (for example, the read voltage level 801(j)) according to the information in the management form 701(j) and the execution of the corresponding data reading and decoding operations.

In an exemplary embodiment, the memory management circuit 502 may update a count value according to the first error bit information. The count value may reflect the number of pieces of data with the total number of error bits being greater than the first threshold and the pieces of data have all been successfully decoded in the decoding operations executed during a past period of time. Taking FIG. 8 as an example, it is assumed that the current count value is P. After successfully decoding the first data read by using the read voltage level 801(1), if the first error bit information reflects that the total number of error bits in the first data is greater than the first threshold, the memory management circuit 502 may update the count value to P+1.

In an exemplary embodiment, before adjusting the sorting information, the memory management circuit 502 may judge whether the count value is greater than another threshold (also referred to as a second threshold). If the count value is greater than the second threshold, the memory management circuit 502 may execute the operation of adjusting the sorting information. However, if the count value is not greater than the second threshold, the memory management circuit 502 may temporarily not adjust the sorting information. In this way, the sorting information may be prevented from being adjusted too frequently and/or the correctness of the adjusted sorting information may be improved.

In an exemplary embodiment, after starting to execute the hard decoding operation, if the management forms 701(0) to 701(E) are exhausted and the information read from the first physical unit cannot be successfully decoded, the memory management circuit 502 may instruct the error detecting and correcting circuit 508 to enter a soft decoding mode. In the soft decoding mode, more read voltage levels may be configured to read the first physical unit to obtain more auxiliary information for improving the decoding success rate. With the assistance of the auxiliary information, the decoding success rate of the error detecting and correcting circuit 508 may be improved. However, compared to the hard decoding operation, the decoding operation executed in the soft decoding mode takes more time. In an exemplary embodiment, the decoding operation executed in the soft decoding mode is also referred to as a soft decoding operation.

Figure 10:
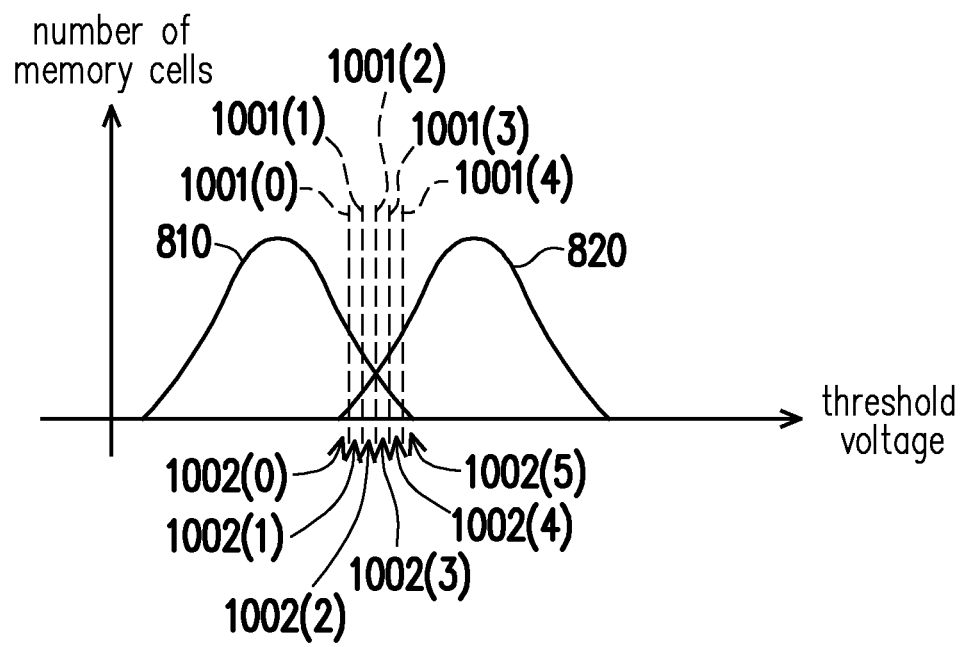
FIG. 10 is a schematic diagram of a soft decoding operation according to an exemplary embodiment of the disclosure.

FIG. 10 is a schematic diagram of a soft decoding operation according to an exemplary embodiment of the disclosure. Please refer to FIG. 10. In the soft decoding operation, multiple read voltage levels (also referred to as soft read voltage levels) 1001(0) to 1001(4) may be configured to read the memory cells in the first physical unit. In particular, the read voltage levels 1001(0) to 1001(4) may be configured to divide a threshold voltage distribution of the memory cells in the first physical unit into multiple voltage regions 1002(0) to 1002(5), as shown in FIG. 10. For example, the voltage region 1002(1) is located between the read voltage levels 1001(0) and 1001(1), and so on. According to reading results of the read voltage levels 1001(0) to 1001(4) on a certain memory cell in the first physical unit, the threshold voltage of the memory cell may be determined to belong to a certain voltage region in the voltage regions 1002(0) to 1002(5). Then, decoding information (for example, log likelihood ratio (LLR)) corresponding to the voltage region may be configured to decode data read from the memory cell. In addition, the reading results of the read voltage levels 1001(0) to 1001(4) on the first physical unit may have more uses to improve the decoding success rate of the soft decoding operation, which is not limited by the disclosure.

Figure 11:
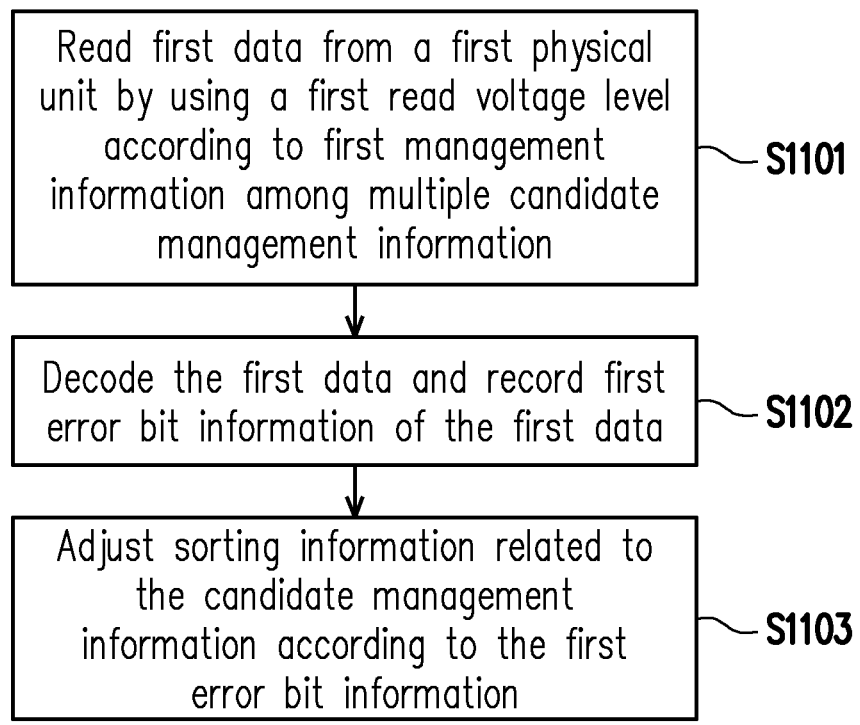
FIG. 11 is a schematic diagram of a memory management method according to an exemplary embodiment of the disclosure.

FIG. 11 is a schematic diagram of a memory management method according to an exemplary embodiment of the disclosure. Please refer to FIG. 11. In Step S1101, first data is read from a first physical unit by using a first read voltage level according to first management information among multiple candidate management information. In Step S1102, the first data is decoded and first error bit information of the first data is recorded. In Step S1103, sorting information related to the candidate management information is adjusted according to the first error bit information. The sorting information may reflect a usage order of the candidate management information in a decoding operation.

Figure 12:
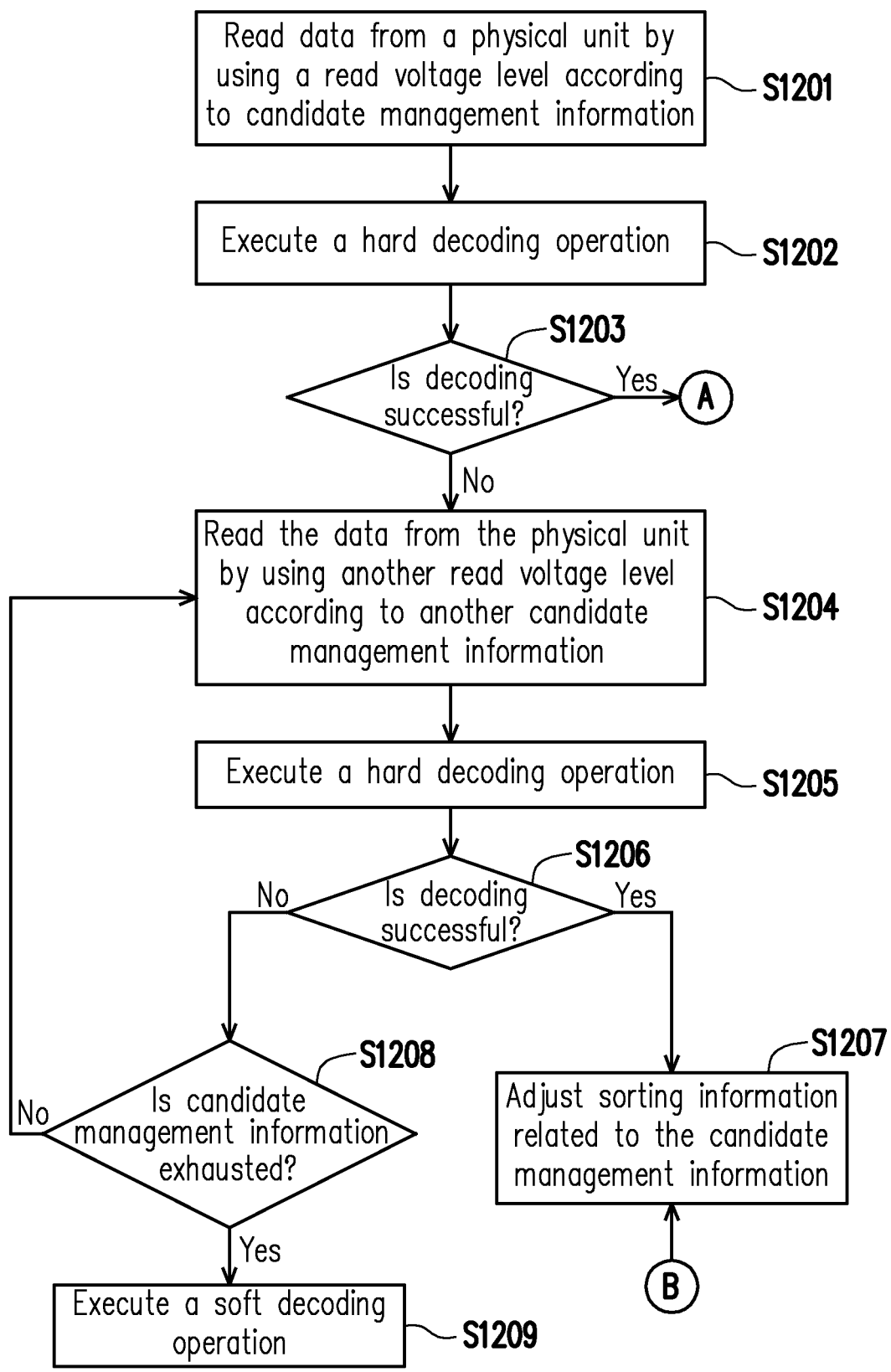
FIG. 12 is a schematic diagram of a memory management method according to an exemplary embodiment of the disclosure.

FIG. 12 is a schematic diagram of a memory management method according to an exemplary embodiment of the disclosure. Please refer to FIG. 12. In Step S1201, data is read from a physical unit by using a read voltage level according to candidate management information. In Step S1202, a hard decoding operation is executed on the data. In Step S1203, it is judged whether the data is successfully decoded. If the data is successfully decoded, Step S1301 of FIG. 13 may be proceeded.

If it is judged in Step S1203 that the data is not successfully decoded, in Step S1204, the data is read from the physical unit by using another read voltage level according to another candidate management information. In Step S1205, a hard decoding operation is executed on the data. In Step S1206, it is judged whether the data is successfully decoded. If the data is successfully decoded, in Step S1207, sorting information related to the candidate management information is adjusted according to the successfully decoded data. For example, the usage priority of the candidate management information currently used in Step S1204 may be increased, as shown in FIG. 9.

If it is judged in Step S1206 that the data is not successfully decoded, then in Step S1208, it is judged whether all candidate management information is exhausted. If there is still unused candidate management information, Step S1204 may be repeated according to the unused candidate management information. In addition, if it is judged in Step S1208 that all candidate management information is exhausted, then in Step S1209, a soft decoding operation is executed.

Figure 13:
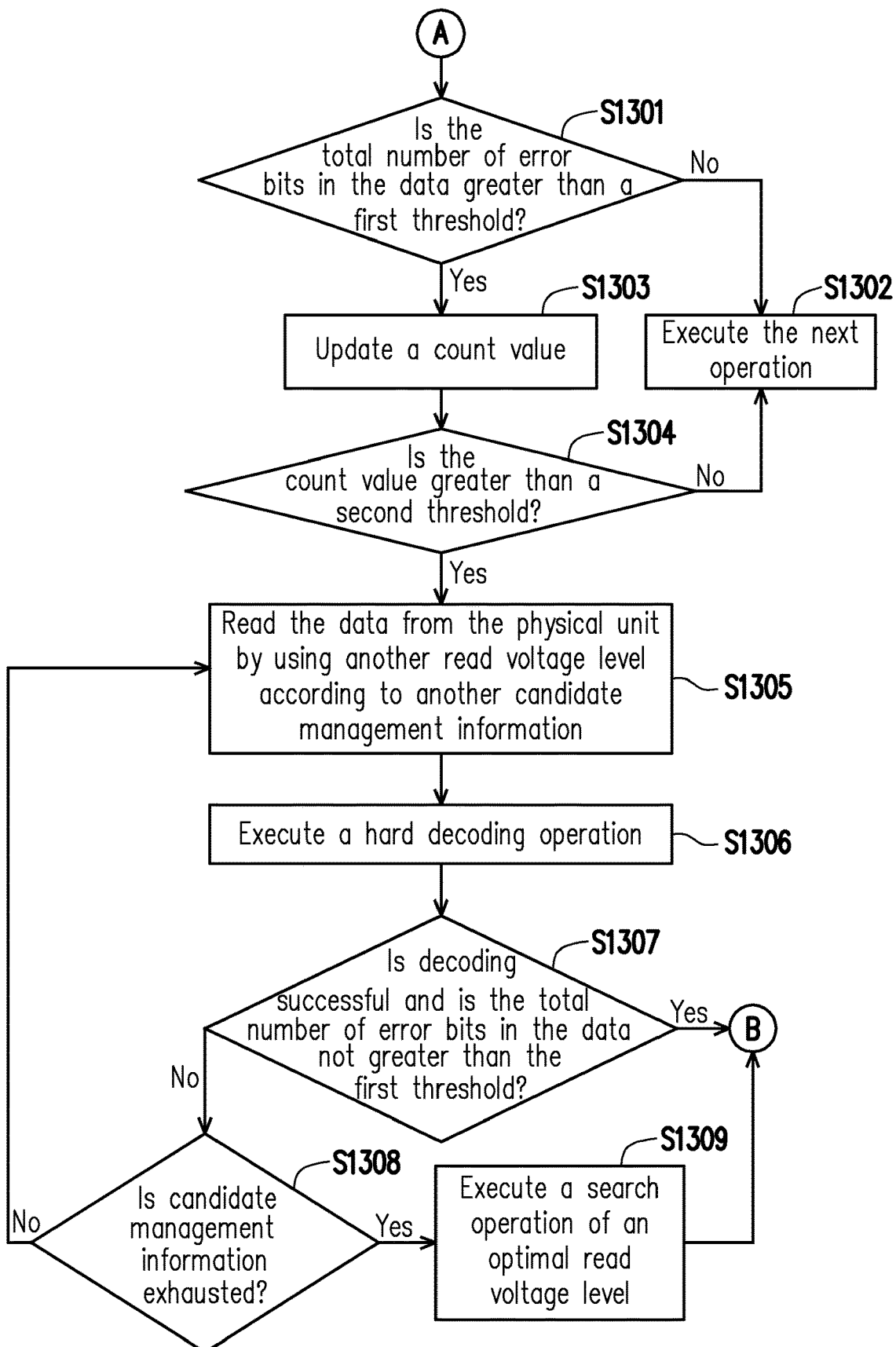
FIG. 13 is a schematic diagram of a memory management method according to an exemplary embodiment of the disclosure.

FIG. 13 is a schematic diagram of a memory management method according to an exemplary embodiment of the disclosure. Please refer to FIG. 13. In Step S1301, it is judged whether the total number of error bits in currently successfully decoded data is greater than a first threshold. If the total number of error bits in the currently successfully decoded data is not greater than the first threshold, in Step S1302, the next operation may be executed. For example, the next operation may include reading and decoding data from the next physical unit, etc., which is not limited by the disclosure.

If it is judged in Step S1301 that the total number of error bits in the currently successfully decoded data is greater than the first threshold, in Step S1303, a count value is updated. For example, the count value may be updated from P to P+1. In Step S1304, it is judged whether the updated count value is greater than a second threshold. If the updated count value is not greater than the second threshold, Step S1302 may be proceeded.

If it is judged in Step S1304 that the updated count value is greater than the second threshold, in Step S1305, the data is read from the physical unit by using another read voltage level according to another candidate management information different from the candidate management information used in Step S1201 of FIG. 12. In Step S1306, a hard decoding operation is executed on the data. In Step S1307, it is judged whether the data is successfully decoded and whether the total number of error bits in the data is not greater than the first threshold. If the data is successfully decoded and the total number of error bits in the data is not greater than the first threshold, Step S1207 of FIG. 12 may be executed.

If it is judged in Step S1307 that the data is not successfully decoded and/or the total number of error bits in the data is greater than the first threshold, in Step S1308, it is judged whether all candidate management information is exhausted. If there is still unused candidate management information, Step S1305 may be repeated according to the unused candidate management information. In addition, if it is judged in Step S1308 that all candidate management information is exhausted, then in Step S1309, a search operation of an optimal read voltage level is executed. After the optimal read voltage level is determined, Step S1207 of FIG. 12 may be executed according to the optimal read voltage level.

However, each step in FIG. 11 to FIG. 13 is described in detail as above, which will not be repeated here. It should be noted that each step in FIG. 11 to FIG. 13 may be implemented as multiple program codes or circuits, which is not limited by the disclosure. In addition, the methods of FIG. 11 to FIG. 13 may be used in conjunction with the above exemplary embodiments or may be used alone, which is not limited by the disclosure.

In summary, the exemplary embodiments of the disclosure may dynamically adjust the sorting information related to the candidate management information according to the error bit information corresponding to the successfully decoded data. In this way, the correctness of data when subsequently executing data reading according to the sorting information can be effectively improved, thereby improving data decoding efficiency.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A memory management method, applicable to a memory storage device, wherein the memory storage device comprises a rewritable non-volatile memory module, and the rewritable non-volatile memory module comprises a plurality of physical units, the memory management method comprising:
   reading first data from a first physical unit among the physical units by using a first read voltage level according to first management information among a plurality of candidate management information;
   decoding the first data and recording first error bit information of the first data, wherein the first error bit information reflects a total number of error bits in the first data; and
   in response to that the total number of the error bits in the first data is greater than a first threshold and the first data is successfully decoded, adjusting sorting information related to the candidate management information according to the first error bit information which reflects the total number of the error bits in the first data, wherein the sorting information reflects a usage order of the candidate management information in a decoding operation.

2. The memory management method according to claim 1, wherein the step of adjusting the sorting information related to the candidate management information according to the first error bit information comprises:
   increasing a usage priority of second management information among the candidate management information, so that the second management information is used before the first management information in a next decoding operation.

3. The memory management method according to claim 1, wherein the step of adjusting the sorting information related to the candidate management information according to the first error bit information comprises:
   reading second data from the first physical unit by using a second read voltage level according to second management information among the candidate management information, wherein the second read voltage level is different from the first read voltage level;
   decoding the second data and recording second error bit information of the second data; and
   adjusting the sorting information related to the candidate management information according to the second error bit information.

4. The memory management method according to claim 3, wherein a total number of error bits in the second data is not greater than a first threshold.

5. The memory management method according to claim 1, wherein the step of adjusting the sorting info illation related to the candidate management information according to the first error bit information comprises:
   executing a search operation to find a third read voltage level; and
   adjusting the sorting information related to the candidate management information according to an execution result of the search operation.

6. The memory management method according to claim 1, further comprising:
   updating a count value according to the first error bit information; and
   not adjusting the sorting information when the count value is not greater than a second threshold.

7. A memory storage device, comprising:
   a connection interface unit, configured to couple to a host system;
   a rewritable non-volatile memory module, comprising a plurality of physical units; and
   a memory control circuit unit, coupled to the connection interface unit and the rewritable non-volatile memory module, wherein
   the memory control circuit unit is configured to send a first read command sequence according to first management info illation among a plurality of candidate management information, wherein the first read command sequence instructs to read first data from a first physical unit among the physical units by using a first read voltage level,
   the memory control circuit unit is further configured to decode the first data and record first error bit information of the first data, wherein the first error bit information reflects a total number of error bits in the first data, and
   in response to that the total number of the error bits in the first data is greater than a first threshold and the first data is successfully decoded, the memory control circuit unit is further configured to adjust sorting information related to the candidate management information according to the first error bit information which reflects the total number of the error bits in the first data, wherein the sorting information reflects a usage order of the candidate management information in a decoding operation.

8. The memory storage device according to claim 7, wherein the operation of adjusting the sorting information related to the candidate management information according to the first error bit information comprises:
   increasing a usage priority of second management information among the candidate management information, so that the second management information is used before the first management information in a next decoding operation.

9. The memory storage device according to claim 7, wherein the operation of adjusting the sorting information related to the candidate management information according to the first error bit information comprises:
   sending a second read command sequence according to second management information among the candidate management information, wherein the second read command sequence instructs to read second data from the first physical unit by using a second read voltage level, and the second read voltage level is different from the first read voltage level;
   decoding the second data and recording second error bit information of the second data; and
   adjusting the sorting information related to the candidate management information according to the second error bit information.

10. The memory storage device according to claim 9, wherein a total number of error bits in the second data is not greater than a first threshold.

11. The memory storage device according to claim 7, wherein the operation of adjusting the sorting information related to the candidate management information according to the first error bit information comprises:
   executing a search operation to find a third read voltage level; and
   adjusting the sorting information related to the candidate management information according to an execution result of the search operation.

12. The memory storage device according to claim 7, wherein the memory control circuit unit is further configured to update a count value according to the first error bit information, and the memory control circuit unit does not adjust the sorting information when the count value is not greater than a second threshold.

13. A memory control circuit unit, configured to control a rewritable non-volatile memory module, wherein the rewritable non-volatile memory module comprises a plurality of physical units, the memory control circuit unit comprising:

a host interface, configured to couple to a host system;

a memory interface, configured to couple to the rewritable non-volatile memory module;

an error detecting and correcting circuit; and a memory management circuit, coupled to the host interface, the memory interface, and the error detecting and correcting circuit, wherein the memory management circuit is configured to send a first read command sequence according to first management information among a plurality of candidate management information, and the first read command sequence instructs to read first data from a first physical unit among the physical units by using a first read voltage level, the error detecting and correcting circuit is configured to decode the first data and record first error bit information of the first data, wherein the first error bit information reflects a total number of error bits in the first data, and in response to that the total number of the error bits in the first data is greater than a first threshold and the first data is successfully decoded, the memory management circuit is further configured to adjust sorting information related to the candidate management information according to the first error bit information which reflects the total number of the error bits in the first data, wherein the sorting information reflects a usage order of the candidate management information in a decoding operation.

14. The memory control circuit unit according to claim 13, wherein the operation of adjusting the sorting information related to the candidate management information according to the first error bit information comprises:

increasing a usage priority of second management information among the candidate management information, so that the second management information is used before the first management information in a next decoding operation.

15. The memory control circuit unit according to claim 13, wherein the operation of adjusting the sorting information related to the candidate management information according to the first error bit information comprises:

sending a second read command sequence according to second management information among the candidate management information, wherein the second read command sequence instructs to read second data from the first physical unit by using a second read voltage level, and the second read voltage level is different from the first read voltage level;

decoding the second data and recording second error bit information of the second data by the error detecting and correcting circuit; and adjusting the sorting information related to the candidate management information according to the second error bit information.

16. The memory control circuit unit according to claim 15, wherein a total number of error bits in the second data is not greater than a first threshold.

17. The memory control circuit unit according to claim 13, wherein the operation of adjusting the sorting information related to the candidate management information according to the first error bit information comprises:

executing a search operation to find a third read voltage level; and adjusting the sorting information related to the candidate management information according to an execution result of the search operation.

18. The memory control circuit unit according to claim 13, wherein the memory management circuit is further configured to update a count value according to the first error bit information, and the memory management circuit does not adjust the sorting information when the count value is not greater than a second threshold.

* * * * *